United States Patent [19]

Hokynar

[11] Patent Number: 4,910,042
[45] Date of Patent: Mar. 20, 1990

[54] APPARATUS AND METHOD FOR TREATING MATERIAL SURFACES

[76] Inventor: Jiri Hokynar, Fraunhoferstrabe 11, 8033 Martinsried, Fed. Rep. of Germany

[21] Appl. No.: 226,400

[22] Filed: Jul. 29, 1988

[30] Foreign Application Priority Data

Jul. 30, 1987 [DE] Fed. Rep. of Germany ....... 3725358

[51] Int. Cl.⁴ .................... C23C 16/00; B05D 3/06
[52] U.S. Cl. ...................... 427/38; 118/723; 118/715; 118/719; 118/725; 156/345; 156/643; 134/1; 134/22.1
[58] Field of Search ............... 427/38; 118/723, 725, 118/715, 719; 156/345, 643; 134/1, 22.1

[56] References Cited

U.S. PATENT DOCUMENTS

| | | | |
|---|---|---|---|
| 4,138,306 | 2/1979 | Niwa | 427/39 |
| 4,232,063 | 11/1980 | Rosler et al. | 427/255.3 |
| 4,576,698 | 3/1986 | Gallagher et al. | 118/715 |
| 4,636,401 | 1/1987 | Yamagaki et al. | 118/713 |
| 4,747,368 | 5/1988 | Brien et al. | 118/725 |
| 4,786,352 | 11/1988 | Benzing | 156/643 |

Primary Examiner—Norman Morgenstern
Assistant Examiner—Roy V. King
Attorney, Agent, or Firm—Arnold, White & Durkee

[57] ABSTRACT

An apparatus and a method for coating electronic elements in particular semi-conductor wafers, circuit boards and the like are provided where the flow of the gaseous coating material is directed so that a contamination of the elements through deposited remains in the reaction tube from previous coating processes can be largely avoided. In addition, an integrated apparatus for cleaning the coating apparatus with a plasma is provided. In an in-situ cleaning method, a plasma generated with microwaves is fed into the reaction tube and the inner surfaces of the reaction tube are cleaned by dry etching.

15 Claims, 1 Drawing Sheet

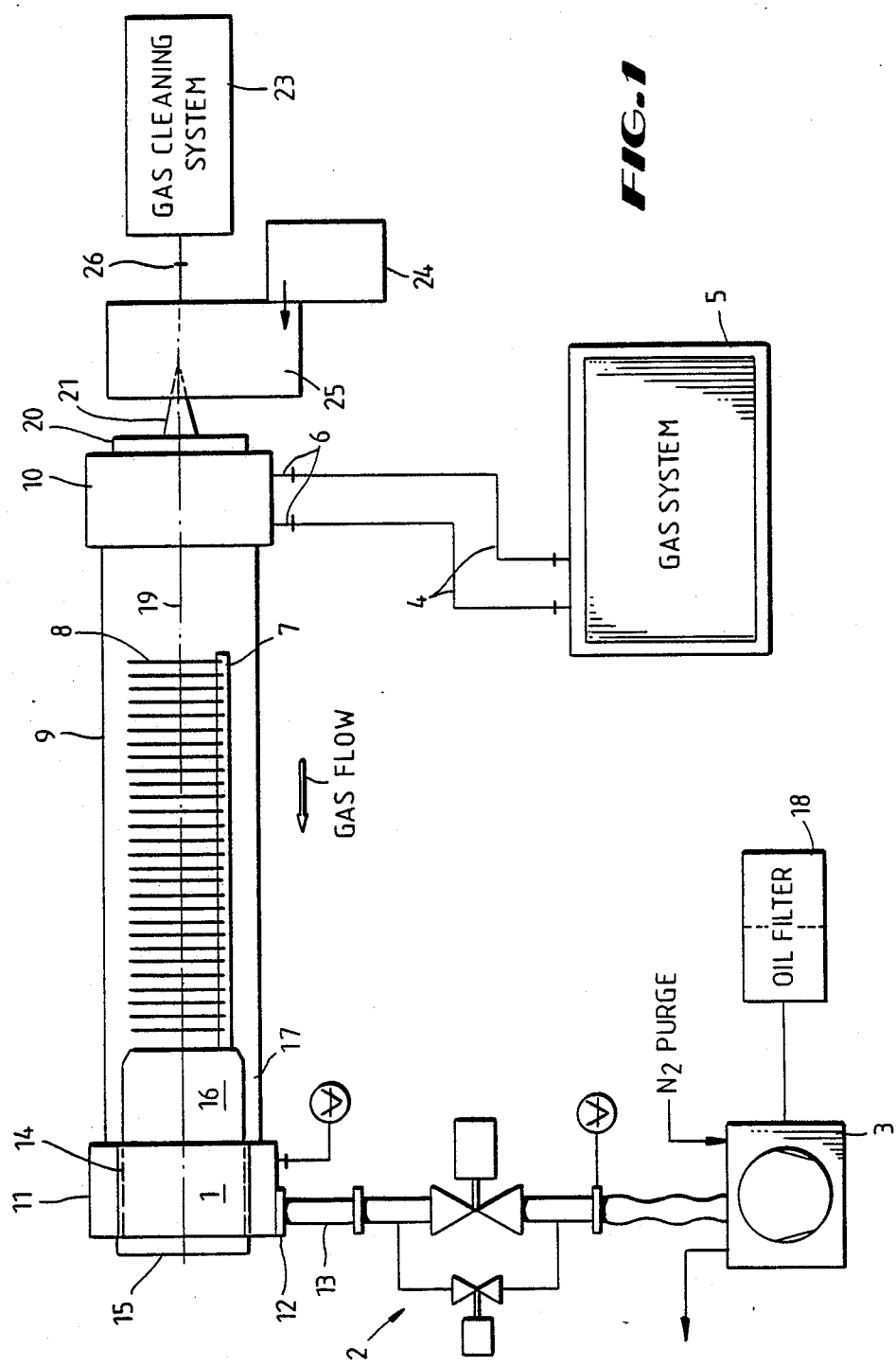

APPARATUS AND METHOD FOR TREATING MATERIAL SURFACES

The invention relates to an apparatus and a method for treating material surfaces, in particular a coating apparatus and a method for coating electronic components or elements such as semi-conductor wafers, circuit boards and the like, as well as an integrated apparatus and method for cleaning the coating apparatus.

When coating electronic elements in a reaction tube, contamination or non-uniform coating of the elements occurs in known apparatus through deposition of the coating material on the inner surface of the reaction tube. The coating is carried out in batch operation and the reaction tube cools between individual coating processes which loosens deposited material. In the next following coating process, loose particles can reach the surface of the element to be coated.

The object of the invention is to provide a coating apparatus and a method which substantially avoids the contamination of the electronic components by residual deposits.

The object of the invention is achieved with a coating apparatus according to claim 1. Preferred embodiments are given in the dependent claims. The apparatus comprises a reaction tube with two end closures, where an opening for loading the reaction tube and a connection for connecting a vacuum line is disposed in one end closure and at least one gas inlet is disposed in the other end closure of the reaction tube. The vacuum line is connected to the end closure with the load or feed opening for the semi-conductor wafers so that the inside of the reaction tube is evacuated on this end closure i.e. on the loading side. Thus a flow connection exists between the vacuum line and the inside of the tube through this end closure or end section.

Further, in accordance with the invention, a coating method is provided as defined in the claims. With a particular arrangement of the gas inlets and outlets, the gas flow can be directed so that the deposited residues are led away from the elements to be coated. In a preferred embodiment, the gases are passed through an annular space or annulus just before leaving the reaction tube, in which an increased gas velocity results and therefore an improved cleaning effect is achieved. This is of great advantage since especially in the front end region of the reaction tube, i.e. that end where the electronic elements are introduced into the reaction tube, with a so-called boat, the deposits or the danger of contamination is very problematic.

A further object of the invention is to provide an integrated cleaning apparatus and a method which allows the removal of deposited remains from the inner surface of the reaction tube or the reaction volume, namely between two coating processes.

The further object of the invention is achieved through a cleaning apparatus as defined in the claims. A resonator cavity with microwave generator is connected to the back end closure of the reaction tube and supplied with cleaning gas from a gas supply system.

In addition, a method for cleaning the coating apparatus is provided according to the invention, as defined in the claims. By generating a plasma with microwaves in the resonator cavity and introducing the plasma into the reaction volume, all deposition surfaces within this volume are cleaned by dry etching. All inner surfaces are reached in this cleaning process, i.e. the inner surfaces of the reaction tube, the inner surfaces of the end closures of the reaction tube and even the surfaces of the boat which is loaded into the reaction tube without electronic elements for cleaning purposes. This method has the advantage that the cleaning process can be carried out between two coating processes without any dismantling or reassembly work on the coating apparatus. Thus an in situ cleaning method is provided which is completely integrated into the production operation and which positively affects the production capacity through the time savings achieved.

The preferred embodiment of the coating apparatus in accordance with the invention comprises both the arrangement for gas feeding and the vacuum connection (as defined), and also the cleaning apparatus using the plasma (as defined). It is particularly preferred that the plasma cleaning apparatus be connected on the same end of the reaction tube at which the gas supply is connected, i.e. on the end lying opposite of or opposed to the loading end.

Further advantages and features of the invention are described in detail in the following description of the embodiments in conjunction with the drawing. FIG. 1 shows a schematic representation of the coating and cleaning apparatus according to the invention.

The coating apparatus in FIG. 1 comprises a reaction volume or chamber, a gas supply means and an evacuation means. The reaction volume is formed with a reaction tube 9 and two end sections or end closures 10 and 11. The coating apparatus is shown in loaded condition in FIG. 1, where the boat 7 supports the elements 8 to be coated, for example wafers, circuit boards or similar electronic components.

The end portion of the boat 7 is provided with a holding member 1, which remains in slidable contact with the opening 14 in the front end closure 11 when the boat is introduced into the reaction tube 9, whereby the boat is supported in loaded or operational condition. The end portion of the boat is further provided with a cylinder-shaped section 16 having a diameter smaller than the inside diameter of the reaction tube 9 and thus forming the annulus 17.

The gas supply means comprise a supply system 5, at least one feed line 4 and at least one gas inlet 6. The feed lines 4 have separate control means so that different gases under various pressures can be introduced into the reaction tube 9. The gas inlets 6 are mounted on the end closure 10 and therefore, different gases can be mixed after entry into the reaction tube 9, when this is required by the process.

The front end region of the reaction tube 9 is enclosed with an end closure 11 and as mentioned is provided with an opening 14 for accepting the boat 7 and also a sealing cover 15. The cover 15 closes the reaction volume airtight and can be opened and closed with simple means for loading and unloading the elements to be coated.

The end closure 11 further comprises a connector 12 which provides the connection to the evacuation means via the vacuum line 13. The evacuation means comprise a pressure control 2 in the vacuum line 13, a vacuum pump 3 and an oil filter 18.

In this preferred embodiment of the invention, the reaction volume 19 is supplied with gas via the back end closure 10 and is evacuated via the front end closure 11, thus establishing a gas flow direction toward the front end as is indicated with an arrow in FIG. 1. With respect to the undesired deposits or remains of coating material from previous coating processes, which frequently arise in the front region of the reaction volume, the preferred embodiment has the advantage that loose deposits on the inner walls of the reaction volume 19 are led away from the electronic elements by the gas flow. Thus the degree of contamination during the coating process is substantially reduced.

In addition, a cleaning apparatus is shown in FIG. 1 which can be completely integrated into a coating apparatus both constructively and operationally. A resonator cavity 25 with microwave generator 24 is connected to the end closure 10 at the backside end region of the reaction volume 19. A cleaning gas supply system 23 feeds the resonator cavity 25 with cleaning gas via a connector 26. In a preferred embodiment of the invention, a halogen containing etching gas is used, in particular one containing fluorine.

The plasma generated in the resonator cavity is directly introduced into the reaction volume 19 via a connection element (20) and a cleaning gas inlet (21) and cleans the inner surfaces of the reaction tube 9 and the end closures 10 and 11 as well as the surfaces of the boat 7 (without electronic elements) including the cylindrical section 16. In the preferred embodiment of the invention, the inner surfaces are cleaned or dry etched with $F^-$ ions of the plasma. The gaseous cleaning products are removed in the front region of the reaction volume 19 via the above-mentioned evacuation means. The cleaning products finally end up in the oil of the vacuum pump 3. An oil purification is provided with the oil filter 18.

Since the contamination of the reaction volume often occurs in the front end region of the reaction tube 9 and on the end closure 11, the section 16 of the boat 7 is constructed in a preferred embodiment of the invention so that an annulus 17 is formed between the section 16 and the reaction tube 9. The narrowing of the gas flow cross-section leads to higher gas velocities in the front end region of the reaction volume and therefore to an improved cleaning effect.

The cleaning apparatus has the great advantage that it can be directly connected to an existing coating apparatus and the production process, namely the coating of electronic elements, is only slightly disturbed. In other words, the cleaning process can be carried out between two coating processes and it is not necessary for example to dismantle the reaction tube and carry out the cleaning at another location.

I claim:

1. Apparatus for coating electronic elements by thermal decomposition of a gas in an evacuated reaction tube, characterized in that, the reaction tube (9) comprising two end closures, a back end closure (10) having at least one gas inlet (6) in the back end region of the reaction tube for introducing a reactive gas into the reaction tube and a connection element (20) for introducing plasma into the reaction tube during cleaning operations, a front end closure (11) in the front end region of the reaction tube for evacuating, loading and unloading the reaction tube, the front end closure having a connector (12) for connecting a vacuum line (13) in the front end region of the reaction tube, an opening (14) for loading and unloading the reaction tube and an airtight cover (15) for sealing the opening (14).

2. Apparatus in accordance with claim 1 characterized in that the reaction tube (9) is a quartz tube.

3. Apparatus in accordance with claim 1 characterized in that the gas inlet (6) is connected via at least one supply line (4) with a gas supply system (5) comprising a separate volume and pressure control for each supply line.

4. Apparatus in accordance with claim 1 characterized in that a holding member (1) is disposed in the front end of the reaction tube free of contact with the inner surface of the reaction tube, said holding member (1) supporting a boat (7) in operational position.

5. Apparatus in accordance with claim 1 characterized in that a holding member (1) disposed in the front end of the reaction tube comprises a cylindrical section (16) with a diameter smaller than the inside diameter of the reaction tube (9), whereby an annulus (17) is formed between the section (16) and the reaction tube (9).

6. Apparatus in accordance with claim 1 characterized by evacuation means (2, 3) connected to the connector (12) in the front end region of the reaction tube.

7. Method for coating electronic elements, characterized in that
    a reaction tube (9) is loaded through a front opening (14) with elements (8) to be coated which are arranged on a boat (7),
    the front end of the reaction tube (9) is closed airtight with a cover (15),
    the reaction tube is evacuated via a connector (12) in the front end region of the reaction tube and maintained at a predetermined vacuum,
    gas is introduced into the back end region of the reaction tube (9) from a gas supply system (5) through at least one feed line (4) via at least one gas inlet (6), where a gas flow in the reaction tube arises from the back end region in the direction toward the front end region of the reaction tube,
    the gas flowing in the reaction tube is heated to decomposition temperature of the gas and the decomposition products are contacted with the elements, in particular deposited on the elements,
    in inlet (6) and the connector (12) are closed following the coating operation, the cover (15) is opened and the coated elements removed.

8. Method in accordance with claim 7 characterized in that the flow velocity of the gas when leaving the reaction tube (9) through an annulus (17) is higher than the flow velocity in the other regions of the reaction tube.

9. Apparatus for treating material surfaces according to claim 1 characterized in that a cleaning apparatus is connected on said back end closure (10) of said reaction tube (9), said cleaning apparatus comprising a resonator cavity (25) with a microwave generator (24), where the resonator cavity is connected to the end closure (10) and is provided with a connector (26) for introducing a cleaning gas which is connected to a cleaning gas source.

10. Apparatus in accordance with claim 9 characterized in that the resonator cavity (25) is connected with the end closure (10) via a connection element (20) and a cleaning gas inlet (21), said connection element (20) comprising a valve for airtight separation of the reaction tube (9) from the cleaning gas inlet (21) during coating operation.

11. Apparatus is accordance with claim 9 characterized in that the resonator cavity (25) is connected via the connector (26) to a cleaning gas supply system (23) having a volume and pressure control for controlling the cleaning gas supply, said supply system (23) supplying a cleaning gas containing a halogen.

12. Apparatus in accordance with claim 9 characterized in that a holding member (1) disposed in the front end of the reaction tube comprises a cylindrical section (16) with a diameter smaller than the inside diameter of the reaction tube (9), whereby an annulus (17) is formed between the section (16) and the reaction tube (9).

13. Method for cleaning a coating apparatus for electronic elements characterized in that a boat (7) without elements to be cleaned is introduced into a reaction tube (9), the front end of the reaction tube (9) is closed airtight with a cover (15), gas inlets (6) disposed on the back end of the reaction tube (9) are closed, the reaction tube is evacuated via a connector (12) in the front end region of the reaction tube and maintained at a predetermined vacuum, a valve in a connection element (20) is opened, a microwave generator (24) is operated, a cleaning gas is fed from a cleaning gas supply system (23) into a resonator cavity (25), the cleaning gas in the resonator cavity (25) is ionized and fed into the reaction tube via an end closure (10) in the back end region of the reaction tube (9), the inside surface of the reaction tube, the inner sides of the back end closure (10) and a front end closure (11) and the outer surfaces of the boat (7) are cleaned by the action of the ionized cleaning gas, the cleaning product gases are discharged from the front end region of the reaction tube.

14. Method in accordance with claim 13 characterized in that a halogen-containing gas is used as the cleaning gas.

15. Method in accordance with claim 13 characterized in that an evacuation means (2,3) is connected to the connector (12), whose circulated oil is cleaned with an oil filter (18).

* * * * *